United States Patent
Mason et al.

(10) Patent No.: US 7,071,018 B2
(45) Date of Patent: Jul. 4, 2006

(54) PROCESS FOR MANUFACTURING A SOLAR CELL

(75) Inventors: Nigel Brunel Mason, Surrey (GB); Richard Walter John Russell, Madrid (ES)

(73) Assignee: BP Solar Limited, Hertfordshire (GB)

( * ) Notice: Subject to any disclaimer, the term of this patent is extended or adjusted under 35 U.S.C. 154(b) by 82 days.

(21) Appl. No.: 10/481,268

(22) PCT Filed: Jun. 17, 2002

(86) PCT No.: PCT/GB02/02673

§ 371 (c)(1),
(2), (4) Date: Dec. 19, 2003

(87) PCT Pub. No.: WO02/103810

PCT Pub. Date: Dec. 27, 2002

(65) Prior Publication Data

US 2005/0074917 A1    Apr. 7, 2005

(30) Foreign Application Priority Data

Jun. 19, 2001    (GB) ................................. 0114896.4

(51) Int. Cl.
*H01L 21/00* (2006.01)
(52) U.S. Cl. ........................................ 438/57; 136/256
(58) Field of Classification Search ............... 136/251, 136/252, 256; 257/431, 433, 436, 448, 457, 257/461; 438/22, 249, 368, 371, 372, 376, 438/392, 542, 549, 558, 560, 565, 567, 57
See application file for complete search history.

(56) References Cited

U.S. PATENT DOCUMENTS

| 5,510,271 A | 4/1996 | Rohatgi et al. |
| 5,899,704 A | 5/1999 | Schlosser et al. |
| 6,552,414 B1 * | 4/2003 | Horzel et al. ............... 257/655 |

FOREIGN PATENT DOCUMENTS

| EP | 0 680 099 A | 11/1995 |
| JP | 61 074378 A | 4/1986 |

OTHER PUBLICATIONS

Hartiti, B. et al; *World Conference on Photovoltaic Energy*, Waikoloa; "Low Temperature Formation of Emitter and BSF by Rapid Thermal Co-Diffusion of P, Al or B"; Dec. 5-9, 1994, New York, IEEE, US, vol. 2, Conf. 1; pp. 1519-1522, XP000680114.

(Continued)

*Primary Examiner*—Asok Kumar Sarkar
(74) *Attorney, Agent, or Firm*—Nixon & Vanderhye

(57) ABSTRACT

Process for incorporating a back surface field into a silicon solar cell by depositing a layer of aluminium on the rear surface of the cell, sintering the aluminium at a temperature between 700 and 1000° C., exposing the cell to an atmosphere of a compound of Group V element and diffusing at a temperature of between 950 and 1000°C. so as to dope exposed p-type silicon surfaces with the Group V element. The step of exposing the cell to an atmosphere of a compound of a Group V element is carried separately from the step of sintering the aluminium layer, and subsequent to the step of depositing a layer of aluminium on the rear surface of the cell.

11 Claims, 1 Drawing Sheet

OTHER PUBLICATIONS

Patent Abstracts of Japan, vol. 1997, No. 11, Nov. 28, 1997, & JP 09 191118 A; Shin Etsu Chem. Co. Ltd., Jul. 22, 1997. (Abstract).

Faika, R. et al; *Proceedings of the 16th European Photovoltaic Solar Energy Conference*; "Novel Techniques to Prevent Edge Isolation of Silicon Solar Cells by Avoiding Leakage Currents Between the Emitter and the Aluminium Rear Contact"; May 1-5, 2000, pp. 1173-1176, XP002176059.

Jooss, W. et al; *16th European Photovoltaic Solar Energy Conference*, "Large Area Buried Contact Solar Cells on Multicrystalline Silicon With Mechanical Surface Texturisation and Bulk Passivation"; vol. II, May 1-5, 2000, pp. 1169-1172, XP002189488.

Jooss, W. et al; *Proceedings of the 16th European Photovoltaic Solar Energy Conference*; "17% Back Contact Buried Contact Solar Cells"; vol. II, May 1-5, 2000, pp. 1124-1127, XP002176515.

Patent Abstracts of Japan, vol. 017, No. 401 (E-1404); Jul. 27, 1993 & JP 05 075148 A; Sanyo Electric Co. Ltd.; Mar. 26, 1993. (Abstract).

He, Shaoqi, et al; *2nd World Conference on Photovoltaic Solar Energy Conversion. / 15th European PV Solar Energy Conference / 27th US IEEE Photovoltaics Specialists Conference / 10th Asia/Pacific PV Science and Engineering Conference*; "Laser Grooved Buried Contact Solar Cell"; Vienna, Australia; Jul. 6-10, 1998; vol. 2, Jul. 6, 1998, pp. 1446-1448, XP0021259939.

* cited by examiner

Back contact

Buried contact

PROCESS FOR MANUFACTURING A SOLAR CELL

This application is the U.S. National Phase of International Application PCT/GB02/02673, filed 17 Jun. 2002, which designated the U.S.

The present invention relates to p-n junction solar cells, and more particularly to processes for fabricating them.

BACKGROUND OF THE INVENTION

Photovoltaic cells made with silicon wafers for terrestrial applications usually comprise a p-type silicon wafer. One surface of the wafer is "doped" (usually with phosphorus at temperatures of 900–1000° C.) to make it n-type and produce the basic p-n junction which is the active component of the solar cell. Metal contacts are then applied to the front and rear surfaces (the n and p surfaces) to enable the photo-generated current to be carried from the cell. In the case of the front contact the metal is typically deposited as an open grid pattern to allow light to be absorbed by the exposed silicon surface. The front grid can be deposited in embedded grooves to reduce grid shading losses. This type of solar cell is often known as a Buried Contact solar cell (also referred to as a Laser Grooved Buried Grid—LGBG solar cell). The basic cell is disclosed in EP 156366A.

The process for fabricating such a cell typically includes the following initial steps:

1) in the case of monocrystalline silicon wafers with [100] crystal orientation, etching of the silicon surface in a caustic solution to form random pyramids;

2) doping the top surface of a p-type silicon wafer with a Group V element, typically phosphorus, to produce the n+ layer;

3) adding a top surface coating of silicon nitride, to act as an antireflection layer and also as a dielectric (non-conducting) layer in order to prevent metal plating on unwanted regions of the top surface;

4) cutting grooves into the surface of the wafer into which metal will be plated. The grooves are typically cut using a laser but may be chemically etched, plasma etched, or mechanically formed using a diamond saw;

5) doping the exposed p-type silicon surface in the grooves n-type with a Group V element, typically phosphorus;

6) treating the cell to provide a back surface field (BSF), by doping the rear surface with an electron "acceptor" such as aluminium or boron;

7) plating metal contacts into the grooves to provide an electrically conducting front contact, and also simultaneously into the rear surface in order to provide an electrically conducting back contact.

Following the above steps, it is necessary to electrically isolate the edges of the wafer. This step is not relevant to the present invention.

A back surface field (step 6) on a crystalline silicon solar cell serves to boost the efficiency of the cell by repelling photo-generated minority charge carriers (electrons in p-type silicon) away from the rear surface where they would otherwise recombine with majority carriers (holes in p-type silicon) before they can be made to do useful work in an external circuit. In high efficiency laboratory cells the BSF is often formed by depositing a film of aluminium by physical vapour deposition and heating to temperatures in excess of 1050° C. (typically over 1100° C.). However, these cells typically achieve a BSF due to special circumstances which are not appropriate for low-cost commercial cell fabrication:

The aluminium thickness used is typically equal to or greater than 2 μm and it has been reported that this is a minimum thickness required for the formation of an effective BSF.

The silicon wafers used are made by Floating Zone (FZ) melting and contain low concentrations of oxygen. These wafers can be heated to high temperatures for extended periods without destroying their electronic performance. For reasons of economy however, commercial cells must be made from Czochralski (CZ) silicon wafers which contain dissolved oxygen impurities and suffer performance degradation when heated above 1000° C. for extended periods.

In commercial solar cells, the BSF is usually formed by printing a thick film (~20 μm) of aluminium or spin-coating a film of a boron containing compound onto the rear surface of the silicon wafer, and heating the film to temperatures in the range 800–900°C. for aluminium (1000–1100° C. for boron), to incorporate the metal at a concentration of about 100 ppm. As a result these cells use a relatively large quantity of aluminium. In cells incorporating a BSF through the use of a thin film (~2 μm) aluminium layer, the rear surface of the wafer typically incorporates a thin dielectric layer of silicon oxide or silicon nitride. In addition to passivating the rear surface, this dielectric layer serves as a barrier to prevent phosphorus atoms from doping the rear surface (during formation of the front junction of the cell or the doping of the groove) and preventing good BSF formation. Doping of the aluminium atoms through this layer is achieved by either high temperature diffusion (in the case of silicon oxide barrier) or through the formation of apertures in the dielectric layer to produce a localised BSF. But this adds additional cost and complexity to cell fabrication.

As a result, there is a need for a method of applying a BSF to a silicon solar cell which is more efficient than that used for commercial cells, and which can also lead to improved cell efficiency.

SUMMARY OF THE INVENTION

The present invention provides a process for incorporating a back surface field into a silicon solar cell which comprises the steps of:

a) depositing a layer of aluminium on the rear surface of the cell;

b) sintering the aluminium layer at a temperature of between 700 and 1000° C.;

c) exposing the cell to an atmosphere of a compound of a Group V element, and diffusing at a temperature of between 950 and 1000° C., so as to dope exposed p-type silicon surfaces with said Group V element.

By subjecting the cell to the Group V element doping after deposition of the aluminium layer, a number of significant advantages are achieved. The absence of the Group V element doping prior to the deposition of the aluminium layer means that the aluminium doping is not compensated by the presence of doped Group V element on the rear surface. Additionally, the requirement for a silicon oxide or silicon nitride coating on the rear surface to prevent doping as mentioned previously is removed, leading to further process economies. Optionally, the sintering step and the subsequent doping step (steps (b) and (c) above) may be combined, leading to further economies in the process. Additionally, this process allows for low-cost CZ wafers to be used whose performance would otherwise be impaired if used in alternative processes employing sintering temperatures in excess of 1000° C.

The aluminium deposition is performed by evaporative deposition or sputtering. Optionally, the front surface of the wafer may be washed, usually with de-ionised water, subsequent to the aluminium deposition and before the sintering, in order to remove any aluminium dust from the front surface where it is not required. The preferred temperature for the sintering of the deposited aluminium is between 850 and 1000° C., particularly between 900 and 960° C. The duration of the sintering is generally no more than 30 minutes, preferably no more than 10 minutes.

Preferably the Group V element is phosphorus or arsenic; more preferably phosphorus. A typical compound used is $POCl_3$ which is oxidized on the wafer surface to $P_2O_5$. The doping is preferably carried out at a temperature of between 960 and 1000° C. Usually the exposed p-type silicon surfaces are in the grooves cut into the surface of the cell.

The silicon cell may be monocrystalline or polycrystalline (multicrystalline).

BRIEF DESCRIPTION OF THE DRAWING

A specific embodiment of the invention will now be described with reference to the accompanying drawing, which shows in diagrammatical form the structure of a typical Buried Contact solar cell.

DETAILED DESCRIPTION OF PREFERRED EMBODIMENTS

Figure 1:
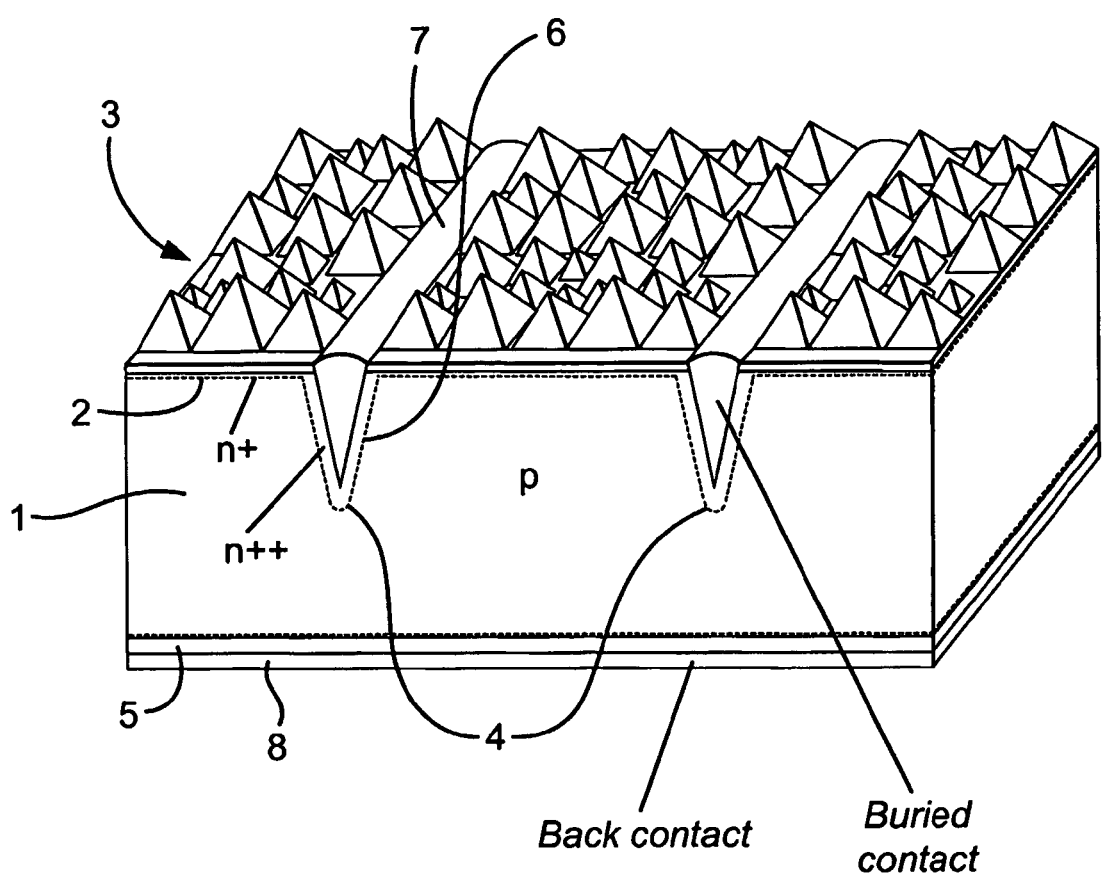
FIG. 1 shows a silicon wafer 1.

As previously described, the first stage in the fabrication process is to dope the top surface 2 of the wafer with phosphorus to produce an n-type layer (as indicated n+ in the diagram). This is done by exposing only the top surface to $POCl_3$ and $O_2$ in a quartz tube furnace at about 800–900° C., so as to provide a thin $P_2O_5$ layer on the silicon surface, the phosphorus of which dopes the silicon in a subsequent higher temperature step.

A silicon nitride coating 3 is then applied to the top surface to provide an antireflection layer; this layer also functions as a dielectric (non-conducting) layer to prevent subsequent metal plating on the top surface, and a barrier to further surface doping of phosphorus during the groove doping step. The silicon nitride is deposited in a quartz tube furnace at 800–900° C. by low pressure chemical vapour deposition, usually using dichlorosilane and ammonia gases.

Parallel grooves 4 are then scribed into the top surface of the silicon using a laser. The grooves are typically 20 μm wide and about 40 μm deep, and about 1.5 mm apart. The wafer is then immersed in a caustic etch to dissolve silicon debris from the laser cutting and to etch the groove walls.

Because the grooves cut through the surface layer of n-type doped silicon to the p-type silicon below, it is necessary to re-dope the exposed p-type surface in the grooves with phosphorus. However in accordance with the present invention, an aluminium layer is deposited on the back surface of the wafer before this is done.

Prior to deposition of the aluminium, the back surface of the wafer may be cleaned and etched by plasma etching and/or submerging the wafer in an acid or alkaline bath. A 0.2–2.0 μm thick layer of aluminium 5 is then deposited by evaporative deposition, after which the wafer is rinsed in water to remove any aluminium dust from the top surface. Then the wafer is sintered in a quartz tube furnace at 950° C.

Following the sintering of the aluminium layer the wafer is immersed in a dilute (0.5 to 4.0%) solution of hydrofluoric acid to remove any silicon oxide growth in the grooves. The wafer is then rinsed in de-ionised water and dried.

Following oxide removal in the grooves, the wafer is treated with $POCl_3$ and $O_2$ in a quartz tube furnace at 980° C. This provides a new n-type layer 6 (denoted n++ in the diagram) on the surfaces of the grooves.

In an alternative embodiment, the steps of sintering the aluminium and depositing the new n-type layer 6 in the grooves are combined, with the high temperature of the doping step also serving to sinter the aluminium.

A base layer of electroless nickel is then deposited in the grooves and also on the rear surface of the wafer. Following sintering, further deposition of nickel, copper and silver is carried out in both the grooves and on the rear surface to provide a conductive copper contact 7 in the grooves and an electrically conducting layer 8 on the rear surface. The cell is then completed by edge isolation (laser scribing and cleaving the edges), in a manner well known to those skilled in the art.

Tests have shown that the process of the invention results in a solar cell having an efficiency approximately 6% greater than that achieved by cells of the prior art: thus the overall efficiency of the cell rises from about 16% to about 17%.

EXAMPLES 1–3

147 $cm^2$ area solar cells were prepared under varying conditions using the following general process.

Starting Material

Use was made of conventional CZ silicon wafers doped p-type with boron to a resistivity of 1.2 ohm.cm and grown with [100] crystal planes parallel to the wafer surface. The wafer dimensions were 127 mm square with rounded corners of a diameter 150 mm. The wafer thickness was 300 μm. Such wafers are commercially available, for example from Bayer Solar GmbH, PV Silicon GmbH or Pillar.

Wafer Surface Preparation

The wafers were anisotropically "texture" etched in a solution of sodium hydroxide and propanol at a temperature of 90° C. and cleaned by subsequent immersions in hydrofluoric acid and hydrochloric acid with intermediate and final rinsing in deionized water followed by drying.

Phosphorus Doping and Silicon Nitride Deposition

Wafers were placed in pairs (touching) in the slots in a quartz wafer carrier and treated in an atmosphere of $POCl_3$ vapour and oxygen at a temperature of 800° C. to deposit a 10 nm thick film of phosphorus glass on the exterior surfaces. The wafers (in their quartz carrier) were then treated in an atmosphere of silicon nitride and ammonia gases at a pressure of 40 Pa and a temperature between 780 and 860° C. to deposit a 110 nm thick film of silicon nitride on the exterior silicon.

Plasma Etch

This is not an essential part of the process but is desirable for good cell results. As a consequence of the previous process, some unwanted silicon nitride is generally deposited around the perimeter of the rear of the wafer (to a distance of 10–20 mm). This film was removed by etching in a gas plasma formed with freon and oxygen. This was achieved by placing the wafers with their front surfaces touching each other and exposing the rear surfaces to the gas plasma.

Laser Grooving A number of grooves were cut into the front surface (the surface with the silicon nitride film) that would subsequently form the conductive grid by which the electrical current is carried. Each groove had dimensions of typically 20 μm width and 40 μm depth and was formed by laser ablation of the surface material using a Nd:YAG laser Q-switched at a frequency of 50 kHz and traversing the wafer surface with a velocity of 500 mm/s. The groove pattern comprised a first group of parallel lines at a pitch of 1.5 mm distributed over the entire surface and a second group of grooves perpendicular to the first group and joined in two bundles with a distance of about 6 cm from each other. Each bundle comprised parallel grooves within a width of 1.5 mm.

Groove Cleaning

The action of laser grooving generally results in silicon debris on the wafer surface and groove sidewalls that contain undesirable crystal imperfections. Accordingly the wafers were etched in a solution of sodium hydroxide at 50° C. to dissolve the silicon debris and etch the groove walls to a depth of a few microns. The wafers were then cleaned by subsequent immersions in hydrofluoric acid and hydrochloric acid with intermediate and final rinsing in de-ionized water followed by drying.

Aluminium Deposition

A film of aluminium of thickness 500 nm was deposited on the rear wafer surface by thermal evaporation (sputtering has also been used). The wafers were then rinsed in de-ionized water to remove any aluminium dust, and dried.

Aluminium Sintering

The silicon wafers were placed in a quartz wafer carrier that was inserted into a quartz tube, and heated to the required temperature (see Table 1 below for temperature) for a period of 15 minutes in an oxygen atmosphere. Following the sintering process the wafers were then cleaned by immersions in hydrofluoric acid and hydrochloric acid with intermediate and final rinsing in de-ionized water followed by drying.

Groove Doping

The silicon wafers were placed in a quartz wafer carrier as pairs (not touching) with the aluminium surfaces facing each other. The carrier was then inserted into a quartz tube and treated in an atmosphere of $POCl_3$ vapour and oxygen at a temperature of 960–1000° C. for 20 minutes to dope phosphorus into the exposed silicon surface to a sheet resistivity of 8 ohm/square.

Nickel Plating

The wafers were immersed in a solution of 4% hydrofluoric acid for 90 seconds and rinsed in de-ionized water. The wafers were then immersed in an alkaline electroless nickel plating solution (Enplate Al-100) for 100s to deposit 0.1 μm Ni film followed by a rinse in de-ionized water before drying.

Nickel Sintering

The nickel-plated wafers were heated to a temperature of 400° C. for 6 minutes in a nitrogen atmosphere to sinter the nickel into the silicon surface.

Copper Plating

Wafers were treated using the following procedure to apply a 5 micron thick film of copper in the grooves and on to the rear surface. A 2 minute immersion in 30% nitric acid was followed by a 10 minute rinse in water, a 30 second immersion in 1% hydrofluoric acid, a 10 minute rinse in water, a 60 second immersion in an acid electroless nickel solution (Enplate Ni-416) at a temperature of 90° C., a 30 second rinse in water, a 120 minute immersion in electroless copper solution (Enplate Cu-703) at a temperature of 50° C., a 10 minute rinse in water, a 6 minute immersion in a solution of silver potassium cyanide at room temperature, and a 10 minute rinse in water followed by drying.

Edge Isolation

The undesired electrically conductive deposits of nickel and copper on the edges were removed by cutting a groove to a depth of 100–150 μm into the silicon surface on the rear of the wafer and around the perimeter at a distance of 1 mm from the wafer edge. Cleaving and discarding the 1 mm silicon at the edge then removed the edge material. The cell was now complete and ready for testing.

Table 1 below shows the different conditions employed in the steps relevant to the present invention and the order in which they were carried out, together with measurements indicating the efficiency of the cells obtained.

Example 1 was carried out according to the prior art method, in that the "Groove Doping" step above was carried out before the "Aluminium Deposition" and "Aluminium Sintering" steps. In Examples 2 and 3, in accordance with the invention the phosphorus doping was carried out after deposition and sintering of the aluminium layer. It can be seen that a sintering temperature of 950° C. gave better results than one of 995° C.

TABLE 1

| Example | Processing Conditions | Isc/A | Voc/V | Efficiency |
|---|---|---|---|---|
| 1 (comparative) | $POCl_3$ doping at 960–1000° C. + 0.5 μm evaporated aluminium + sinter at 700° C. | 5.29 | 603 | 16.8% |
| 2 | 0.5 μm evaporated aluminium + sinter in $O_2$ at 950° C. for 10 min + $POCl_3$ doping at 960–1000° C. | 5.48 | 611 | 17.9% |
| 3 | 0.5 μm evaporated aluminium + sinter in $O_2$ at 995° C. for 30 min + $POCl_3$ doping at 960–1000° C. | 5.37 | 610 | 17.5% |

Isc = short circuit current of cell under 1000 $W/m^2$ illumination with AM1.5G spectrum
Voc = open circuit voltage of cell under 1000 $W/m^2$ illumination with AM1.5G spectrum
Efficiency = electrical energy output over light energy input

EXAMPLES 4–11

The process of Examples 2 and 3 was repeated using a variety of sintering tempertures and times. For comparison, a cell with a BSF applied according to the prior art process as in Example 1 above was also tested. The results are shown in Table 2. It can be seen that generally, lower sintering temperatures and shorter sintering times result in higher efficiencies.

TABLE 2

| Example | Al sintering temp and time | No. of cells | Isc/A | Voc/V | FF(%) | Eff(%) |
|---|---|---|---|---|---|---|
| 4 | prior art process | 26 | 5.18 | 604 | 77.1 | 16.4 |
| 5 | 995° C. for 30 min | 9 | 5.26 | 609 | 78.1 | 17.0 |
| 6 | 950° C. for 50 min | 9 | 5.22 | 607 | 78.5 | 16.9 |

TABLE 2-continued

| Example | Al sintering temp and time | No. of cells | Isc/A | Voc/V | FF(%) | Eff(%) |
|---|---|---|---|---|---|---|
| 7 | 950° C. for 25 min | 10 | 5.37 | 613 | 78.6 | 17.6 |
| 8 | 950° C. for 10 min | 10 | 5.42 | 615 | 78.7 | 17.8 |
| 9 | 900° C. for 50 min | 10 | 5.40 | 615 | 78.5 | 17.7 |
| 10 | 900° C. for 25 min | 10 | 5.41 | 616 | 78.4 | 17.7 |
| 11 | 900° C. for 10 min | 11 | 5.41 | 616 | 78.6 | 17.8 |

FF = Fill Factor, a measure of power out/(Isc*Voc)

No. of cells is the number of cells tested to obtain the average values given in the Table

The invention claimed is:

1. Process for incorporating a back surface field into a silicon solar cell, which comprises the steps of:
    a) depositing a layer of aluminium on a rear surface of the cell;
    b) sintering the aluminium layer at a sintering temperature of between 700 and 1000° C.;
    c) exposing the cell to an atmosphere of a compound of a Group V element, and diffusing at a temperature of between 950 and 1000° C., so as to dope exposed p-type silicon surfaces with said Group V element, wherein step (c) is carried out separately from step (b) and subsequent to step (a).

2. Process according to claim 1, wherein the sintering temperature in step (b) is between 850 and 1000° C.

3. Process according to claim 1, wherein the duration of the sintering in step (b) no more than 30 minutes.

4. Process according to claim 1, wherein the Group V element is phosphorus or arsenic.

5. Process according to claim 1, wherein the compound of the Group V element is $POCl_3$.

6. Process according to claim 1, wherein doping of step c) is carried out at a temperature of between 960 and 1000° C.

7. Process according to claim 1, wherein the exposed p-type silicon surfaces are in the grooves cut into the surface of the cell.

8. Process according to claim 1, wherein the silicon is monocrystalline.

9. Process according to claim 1, wherein the sintering temperature in step (b) is between 900 and 960° C.

10. Process according to claim 1, wherein the duration of the sintering in step (b) no more than 10 minutes.

11. Process according to claim 1, wherein the aluminium is deposited to a thickness of 0.2 to 2.0 μm.

* * * * *